United States Patent
Chen

(10) Patent No.: US 10,243,433 B2
(45) Date of Patent: Mar. 26, 2019

(54) REFRIGERATING MACHINE WITH DETACHABLE HALL ELEMENT

(71) Applicant: Tzu-Chiang Chen, Taoyuan (TW)

(72) Inventor: Tzu-Chiang Chen, Taoyuan (TW)

( * ) Notice: Subject to any disclaimer, the term of this patent is extended or adjusted under 35 U.S.C. 154(b) by 0 days.

(21) Appl. No.: 15/884,370

(22) Filed: Jan. 30, 2018

(65) Prior Publication Data

US 2018/0351436 A1  Dec. 6, 2018

(30) Foreign Application Priority Data

Jun. 1, 2017  (TW) .............................. 106118129 A

(51) Int. Cl.
| | |
|---|---|
| *H02K 11/215* | (2016.01) |
| *F25B 9/14* | (2006.01) |
| *F25B 31/02* | (2006.01) |
| *H02K 7/08* | (2006.01) |
| *H05K 5/00* | (2006.01) |

(52) U.S. Cl.
CPC .............. *H02K 11/215* (2016.01); *F25B 9/14* (2013.01); *F25B 31/026* (2013.01); *H02K 7/085* (2013.01); *H02K 2211/03* (2013.01); *H05K 5/0008* (2013.01); *H05K 5/0047* (2013.01)

(58) Field of Classification Search
CPC .. H02K 11/215; H02K 7/085; H02K 2211/03; F25B 9/14; F25B 31/026; H05K 5/0008; H05K 5/0047
USPC ....................................................... 310/68 B
See application file for complete search history.

(56) References Cited

U.S. PATENT DOCUMENTS

| | | | | |
|---|---|---|---|---|
| 4,365,982 A | * | 12/1982 | Durenec ................... | F25B 9/14 62/6 |
| 5,927,079 A | * | 7/1999 | Sekiya ..................... | F25D 17/02 60/520 |
| 5,987,886 A | * | 11/1999 | Sekiya ..................... | F02G 1/043 60/523 |
| 6,094,912 A | | 8/2000 | Williford | |
| 6,161,389 A | * | 12/2000 | Sekiya ..................... | F02G 1/043 62/6 |
| 6,279,325 B1 | * | 8/2001 | Sekiya ..................... | F02G 1/043 62/520 |
| 7,587,896 B2 | * | 9/2009 | Bin-Nun ................... | F25B 9/14 60/517 |

(Continued)

FOREIGN PATENT DOCUMENTS

| | | | | |
|---|---|---|---|---|
| CN | 206020450 U | | 3/2017 | |
| JP | 2006200767 A | * | 8/2006 | ........... F02G 1/0435 |
| TW | 201643381 A | | 12/2016 | |

*Primary Examiner* — Alex W Mok
(74) *Attorney, Agent, or Firm* — Ming Chow; Sinorica, LLC

(57) ABSTRACT

A refrigerating machine having a detachable Hall element is provided with a cold heat exchange mechanism. The cold-heat exchange mechanism is driven by a driving assembly to generate a low temperature cooling zone at one end of the cold heat exchange mechanism. The driving assembly is composed of at least one rotor and a stator. After the power is input, the rotor can rotate a shaft to drive the cold-heat exchange mechanism to work. The driving assembly further has at least one Hall element and a circuit board on which the Hall element is mounted. Therefore, when the Hall element is damaged, the circuit board can be easily removed for replacement or repair.

4 Claims, 3 Drawing Sheets

(56) References Cited

U.S. PATENT DOCUMENTS

| | | | | |
|---|---|---|---|---|
| 2007/0178723 A1* | 8/2007 | Kataoka | ............ | H02K 3/50 |
| | | | | 439/76.2 |
| 2007/0261407 A1* | 11/2007 | Bin-Nun | ............ | F25B 9/14 |
| | | | | 60/645 |
| 2007/0261419 A1* | 11/2007 | Bin-Nun | ............ | F25B 9/00 |
| | | | | 62/6 |
| 2009/0205361 A1* | 8/2009 | James | ............ | F25B 43/00 |
| | | | | 62/510 |
| 2014/0290277 A1* | 10/2014 | Yamada | ............ | F25B 9/14 |
| | | | | 62/6 |
| 2014/0318155 A1* | 10/2014 | Morie | ............ | F25B 9/14 |
| | | | | 62/6 |
| 2016/0169236 A1* | 6/2016 | Oda | ............ | F04D 17/122 |
| | | | | 62/498 |
| 2017/0146271 A1* | 5/2017 | Hasegawa | ............ | F04D 29/058 |
| 2017/0222528 A1* | 8/2017 | Tsuchida | ............ | H02K 21/16 |
| 2017/0248355 A1* | 8/2017 | Knopp | ............ | F25B 43/00 |
| 2017/0248356 A1* | 8/2017 | Lee | ............ | F04C 23/008 |
| 2017/0288512 A1* | 10/2017 | Kagawa | ............ | H02K 11/33 |

\* cited by examiner

REFRIGERATING MACHINE WITH DETACHABLE HALL ELEMENT

BACKGROUND OF THE INVENTION

1. Field of the Invention

The present invention relates to a refrigerating machine that provides improved efficiency for cooling electronic components.

2. Description of the Prior Arts

Based on the Stirling cycle principle, a conventional refrigerating machine provides a low temperature region. The low temperature region can be applied to medical devices, for example, for preservation of human organs. When applied in an infrared detector, the infrared detector will have better detecting effects and safety. In addition, the normal low temperature can be applied to fill liquid nitrogen, insulation ice bags and so on.

The Stirling cycle principle describes operations of a Stirling module. For a container filled with gas and having a gas separator therein, when the temperature difference between the two ends of the container is sufficient, the gas in the two spaces separated by the gas separator can be expanded and contracted cyclically to generate power because of the temperature difference. Conversely, if an external force such as a motor is applied to the Stirling module, a hot zone and a cold zone having a temperature difference to the hot zone can be formed at both ends of the container.

As shown in FIG. 3, a conventional motor for driving a Stirling module of the refrigerating machine includes a cold-heat exchange mechanism 50. A power input of the cold-heat exchange mechanism 50 is connected to a motor. The motor includes a housing 51, a coil unit 52, a plurality of Hall elements 53, and a rotor 54. The housing 51 is a hollow body having an opening at one end. The coil unit 52 is fixed inside the housing 51. Each of the Hall elements 53 is disposed on an inner side of the coil unit 52. One end of the rotor 54 is pivoted to the housing 51 and another end is connected to the power input of the cold-heat exchange mechanism 50.

When the conventional refrigerating machine is in use, the coil unit 52 and the rotor 54 work by magnetic induction, and then the temperature between them will increase and heat will be generated. As the coil unit 52 and the rotor 54 are located in the housing 51 and heat dissipation is not good, the magnetic induction is worsened and even the Hall elements 53 are easily damaged. However, the Hall element 53 cannot be repaired individually when damaged. The entire module must be replaced with a new one. As a result, the cost is increased.

To overcome the shortcomings, the present invention provides a refrigerating machine with a detachable Hall element to mitigate or obviate the aforementioned problems.

SUMMARY OF THE INVENTION

In view of the shortcomings of the conventional refrigerating machine, the present invention provides a refrigerating machine with a detachable Hall element. The Hall element can be mounted on a detachable circuit board so as to be easily repaired and replaced.

To achieve the foregoing objective, the refrigerating machine comprises:

a cold-heat exchange mechanism having a power input end;

a driving assembly connected to the power input end of the cold heat exchange mechanism;

wherein the driving assembly has:

a rotor having a magnet and a shaft, wherein the magnet is fixed to one end of the shaft and another end of the shaft is connected to the power input of the cold-heat exchange mechanism;

a cap being a hollow shell and mounted on the cold heat exchange mechanism, wherein one end of the rotor having the magnet fixed thereto is rotatably held inside the cap;

a coil assembly having a housing, a coil unit, a plurality of circuit boards and at least one Hall element, wherein the housing is a hollow body and has an opening at one end, each of the circuit boards is disposed inside the housing, the at least one Hall element is connected to the circuit board and extends downward from the circuit board, the end having the opening of the housing is fixed to the cold heat exchange mechanism, and the at least one Hall element corresponds in position to the magnet of the rotor.

The Hall element is mounted on the circuit board at a position corresponding to where a magnet of the rotor is mounted, and there is a distance between the Hall element and the rotor. When the Hall element is damaged by heat generated, the housing can be removed from the base of the cold-heat exchange mechanism to repair or replace the Hall element, thereby reducing the cost.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
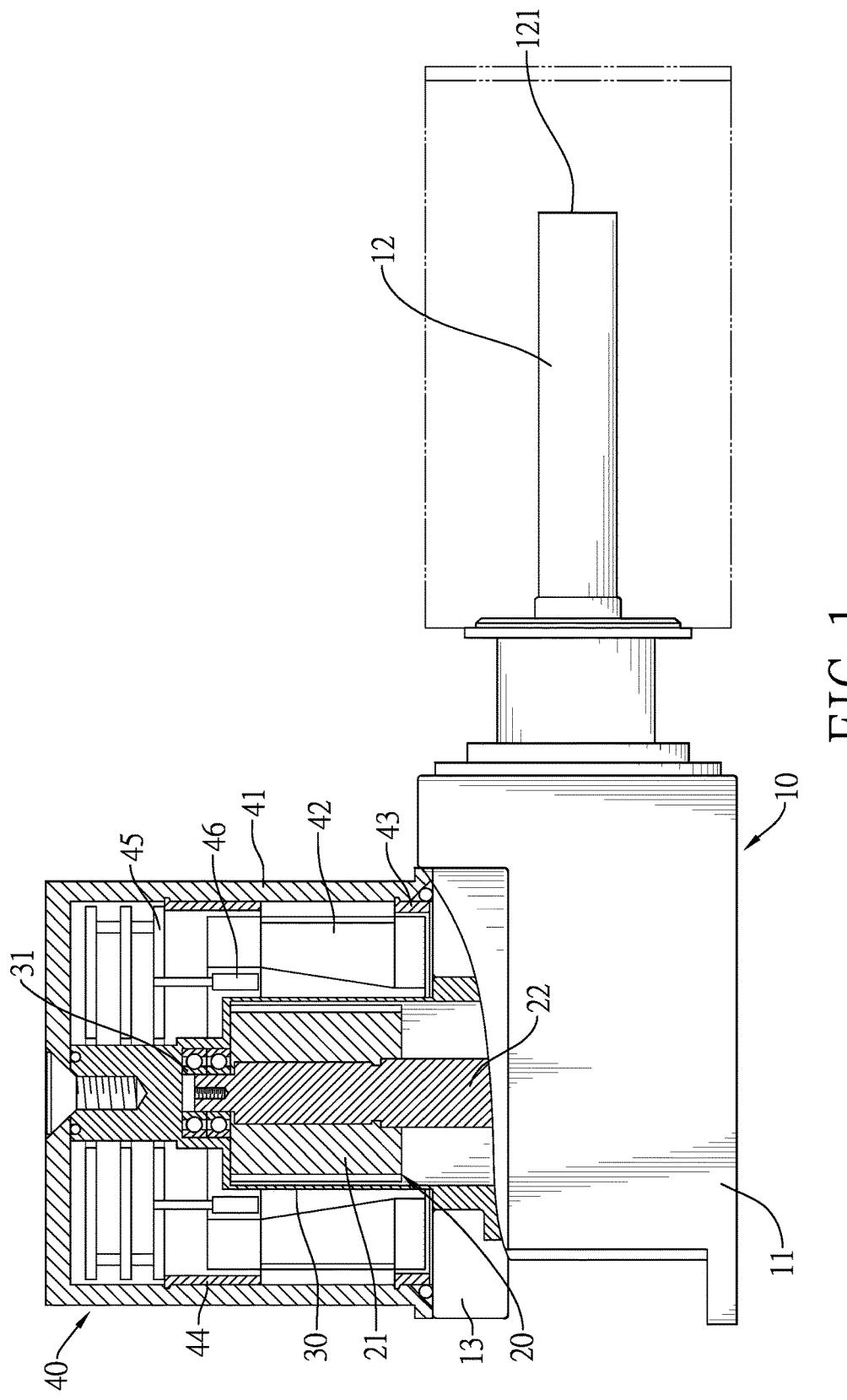
FIG. 1 is a sectional view of part of the present invention.
Figure 2:
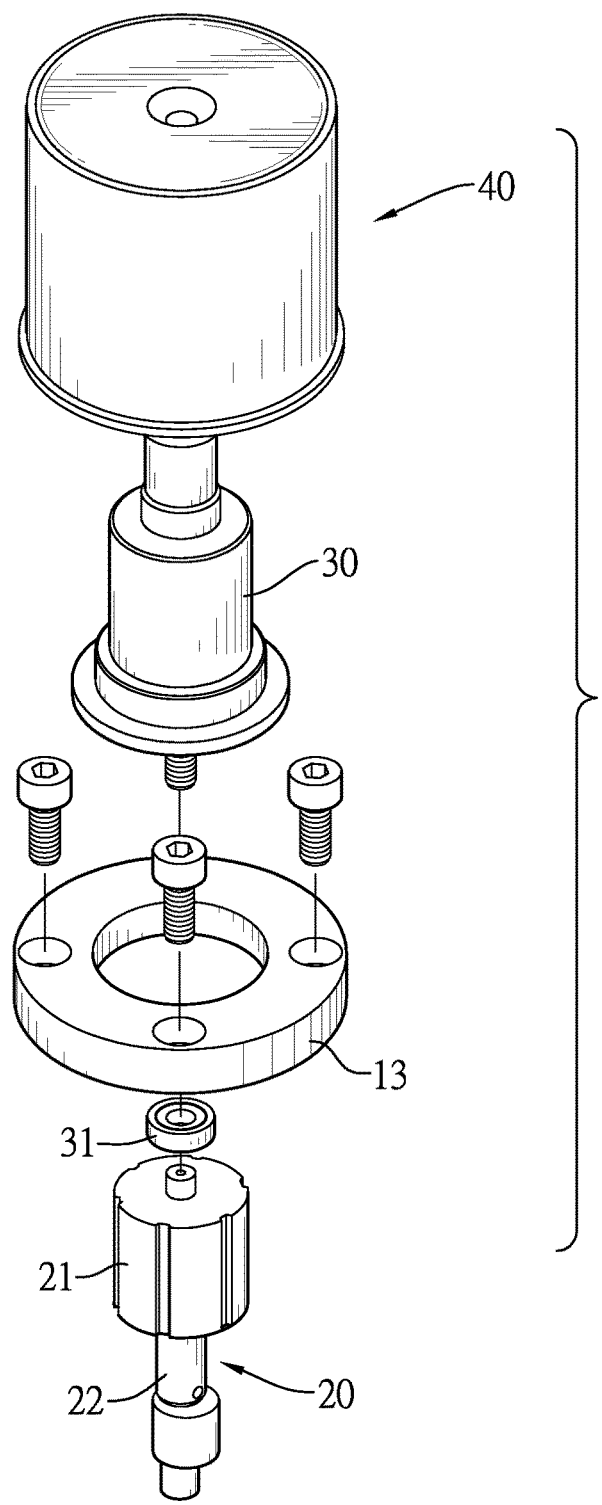
FIG. 2 is an exploded view of the present invention.
Figure 3:
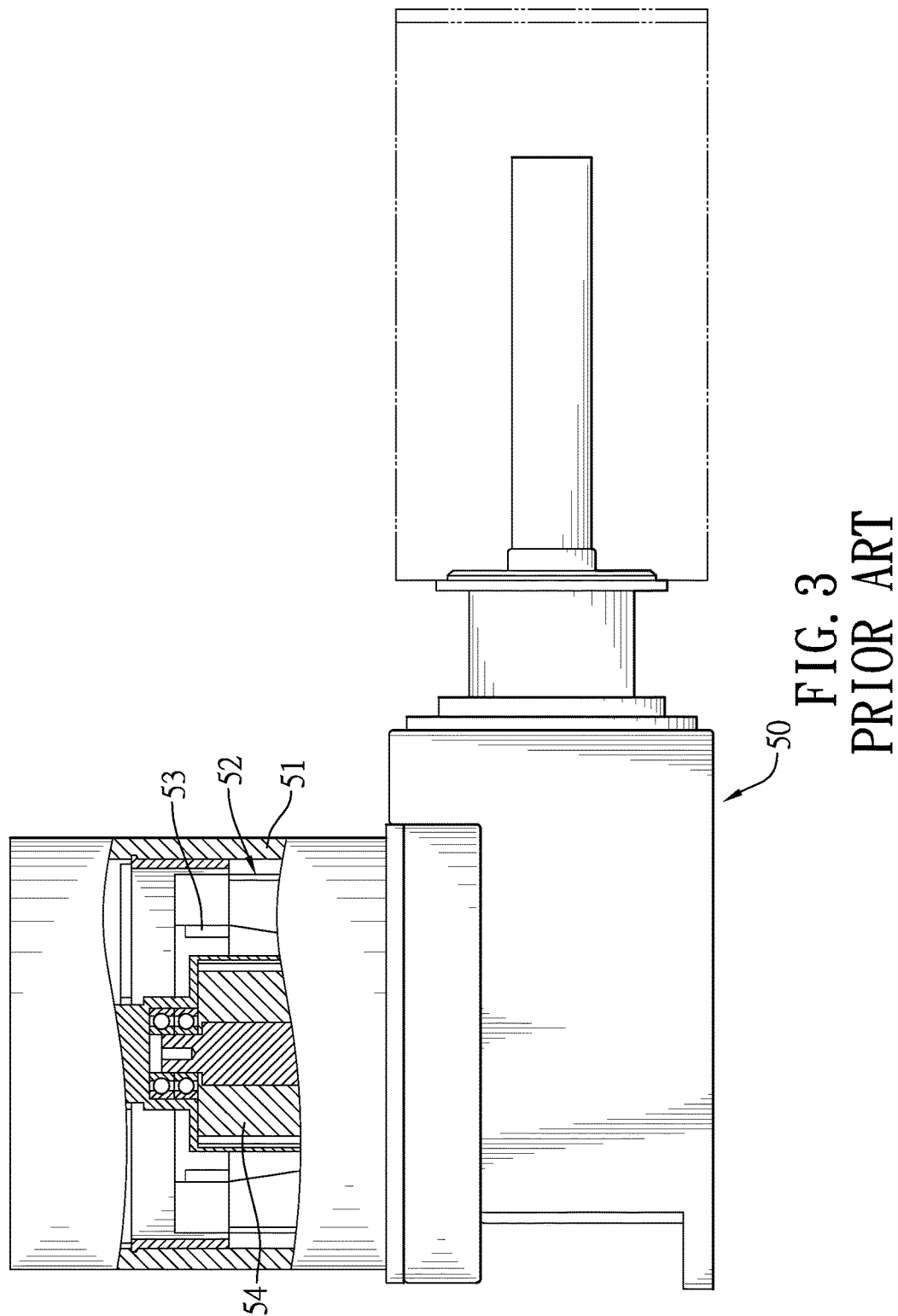
FIG. 3 is a sectional view of a conventional motor for driving a Stirling module of a refrigerating machine.

With reference to FIG. 1 and FIG. 2, the present invention is a refrigerating machine with a detachable Hall element and comprises a cold-heat exchange mechanism 10 and a driving assembly.

The cold-heat exchange mechanism 10 may use a Stirling engine to provide a cooling end. An embodiment of the cold-heat exchange mechanism 10 includes a base 11 having a Stirling engine mechanism therein. One side of the base 11 is provided with a cooling rod 12 and another side of the base 11 is provided with a fixing base 13. A cooling zone 121 is at a distal end of the cooling rod 12. When the cold-heat exchange mechanism 10 operates, the cooling rod 12 can be brought into a low temperature state by the operation of the Stirling engine mechanism provided in the cold-heat exchange mechanism 10, which is well known in the art and not described in detail herein. In practice, the cooling zone 121 of the cooling rod 12 can be applied to cool an electronic component that generates heat. For example, the electronic component is a chip and causes a high temperature when it operates. The high temperature will affect the performance of the chip. Therefore, when the cooling zone 121 of the cooling rod 12 is applied to the electronic component, the cooling zone 121 effectively reduces the temperature of the electronic component so that the electronic component can work normally.

The driving assembly includes a rotor 20, a cap 30, and a coil assembly 40. The driving assembly drives the cold-heat exchange mechanism 10 to operate. The rotor 20 comprises a magnet 21 and a shaft 22. The magnet 21 can be a cylindrical permanent magnet and is fixed to one end of the shaft 22. Another end of the shaft 22 extends into the base 11 of the cold-heat exchange mechanism 10 and is connected to a corresponding mechanism. The rotor 20 drives the cold-heat exchange mechanism 10 to operate.

The cap 30 is hollow and is mounted on the fixing base 13 of the cold-heat exchange mechanism 10. The magnet 21 of the rotor 20 can be covered by the cap 30. A bearing 31 is mounted inside the cap 30 and is connected to one end of the shaft 22 provided with the magnet 21, so the shaft 22 can be smoothly rotated in the cap 30 and the base 11.

The coil assembly 40 comprises a housing 41, a coil unit 42, a positioning element 43, a spacer 44, a plurality of circuit boards 45 and at least one Hall element 46. The housing 41 has a hollow body and an opening formed at one end of the hollow body. Each circuit board 45 is disposed inside the housing 41 and is positioned by the spacer 44. The spacer 44 is disposed in the housing 41 and connected with the housing 41. Each of the at least one Hall elements 46 is connected to the circuit board 45 and extends downward from the circuit board 45.

The coil unit 42 has a configuration of a hollow body and is mounted in the housing 41 and adjacent to the opening of the housing 41. The positioning element 43 is disposed between the coil unit 42 and the housing 41 for connecting and fixing the coil unit 42 to the housing 41. The end forming the opening of the housing 41 is attached to the fixing base 13. The coil unit 42 is disposed outside the cap 30 and at a position corresponding to the magnet 21. By the magnetic induction between the coil unit 42 as a stator and the magnet 21 as a rotor, the rotor 20 can be rotated. Each of the at least one Hall element 46 inside the coil unit 42 detects the magnet position of the rotor 20.

Since each of the at least one Hall element 46 is mounted away from an inner surface of the coil unit 42, the Hall element 46 would not be easily damaged by heat generated from the coil unit 42 and the rotor 20. If any Hall element 46 is damaged, the Hall element 46 of the circuit board 45 can be replaced and reassembled after the housing 41 is removed. Therefore, the present invention can reduce costs without replacing the entire refrigerating machine.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A refrigerating machine comprising:
    a cold-heat exchange mechanism having a power input end;
    a driving assembly connected to the power input end of the cold heat exchange mechanism;
    wherein the driving assembly has:
        a rotor having a magnet and a shaft, wherein the magnet is fixed to one end of the shaft and another end of the shaft is connected to the power input end of the cold-heat exchange mechanism,
        a cap being a hollow shell and mounted on the cold heat exchange mechanism, wherein one end of the shaft having the magnet fixed thereto is rotatably held inside the cap;
        a coil assembly having a housing, a coil unit, a plurality of circuit boards and at least one Hall element, wherein the housing is a hollow body and has an opening at one end, each of the circuit boards is disposed inside the housing, the at least one Hall element is connected to the circuit boards and extends downward from the circuit boards, the end having the opening of the housing is fixed to the cold heat exchange mechanism, and the at least one Hall element corresponds in position to the magnet of the rotor.

2. The refrigerating machine as claimed in claim 1, further comprising:
    a positioning element and a spacer, wherein the positioning element is disposed between the coil unit and the housing to connect and fix the coil unit to the housing, and the spacer is for assembling and positioning the circuit board to the housing.

3. The refrigerating machine as claimed in claim 1, further comprising:
    a bearing disposed in the housing and connected to one end of the rotor.

4. The refrigerating machine as claimed in claim 3, wherein the cold-heat exchange mechanism has a base with a cooling rod at one side of the base and a fixing base at another side of the base, wherein the fixing base is connected with the housing, and a cooling zone is formed at a distal end of the cooling rod.

\* \* \* \* \*